(12) United States Patent
Kawazoe et al.

(10) Patent No.: US 8,795,786 B2
(45) Date of Patent: Aug. 5, 2014

(54) TRANSPARENT CONDUCTIVE SUBSTRATE (75) Inventors: Syozou Kawazoe, Minamikawachi-gun (JP); Kenji Hashimoto, Minamikawachi-gun (JP)

(73) Assignee: Meihan Shinku Kogyo Co., Ltd., Osaka (JP)

( * ) Notice: Subject to any disclaimer, the term of this patent is extended or adjusted under 35 U.S.C. 154(b) by 96 days.

(21) Appl. No.: 13/696,879

(22) PCT Filed: May 11, 2011

(86) PCT No.: PCT/JP2011/060869
§ 371 (c)(1),
(2), (4) Date: Nov. 8, 2012

(87) PCT Pub. No.: WO2011/142392
PCT Pub. Date: Nov. 17, 2011

(65) Prior Publication Data
US 2013/0056050 A1  Mar. 7, 2013

(30) Foreign Application Priority Data
May 12, 2010 (JP) .................................. 2010-109960

(51) Int. Cl.
*H01L 33/42* (2010.01)

(52) U.S. Cl.
USPC ........... 427/453; 136/256; 257/59; 252/218.1

(58) Field of Classification Search
USPC ....................................................... 136/256
See application file for complete search history.

(56) References Cited

FOREIGN PATENT DOCUMENTS

| JP | 61-205925 | | 9/1986 |
|----|-----------|---|--------|
| JP | 61-227945 | | 10/1986 |
| JP | 63-089656 | | 4/1988 |
| JP | 02-027617 | | 1/1990 |
| JP | 02-213006 | | 8/1990 |
| JP | 08-027561 | | 1/1996 |
| JP | H08-27561 | * | 1/1996 |

OTHER PUBLICATIONS

International Search Report issued Aug. 30, 2011 in International (PCT) Application No. PCT/JP2011/060869.

* cited by examiner

*Primary Examiner* — Jayne Mershon
(74) *Attorney, Agent, or Firm* — Wenderoth, Lind & Ponack, L.L.P.

(57) ABSTRACT

Disclosed are a transparent conductive substrate comprising a transparent conductive thin film layer and a transparent metal oxide layer disposed in this order on one or both surfaces of a substrate, the transparent metal oxide layer having numerous fine pores penetrating from the front surface to the rear surface thereof, and the pore diameters of the pores at the surface that is opposite to the surface that is in contact with the transparent conductive thin film layer being larger than those at the surface that is in contact with the transparent conductive thin film layer; and a method for producing the transparent conductive substrate, comprising forming the transparent metal oxide layer on the surface of the transparent conductive thin film layer or transparent conductive thin film layers by oblique deposition.

9 Claims, 3 Drawing Sheets

TRANSPARENT CONDUCTIVE SUBSTRATE

TECHNICAL FIELD

The present invention relates to a transparent conductive substrate and a method for producing the transparent conductive substrate.

BACKGROUND ART

Transparent conductive substrates having a transparent metal oxide conductive layer (such as ITO and ZnO) formed on a transparent substrate are used for touch panels, solar cells, electromagnetic wave/electrostatic shields, ultraviolet/infrared ray shields, and other applications because of their transparency and conductivity.

However, conventional products have the following drawbacks.
1) The light reflection of visible light on the surface of metal oxide conductive layers is large, and their transparency is poor.
2) Metal oxide conductive layers absorb light at around near ultraviolet ray; therefore, the transmittance of light wavelengths of <450 nm decreases, resulting in yellowing of the layers.

Because of the above drawbacks 1) and 2), the difference between portions having a pattern and portions having no pattern can be clearly recognized when metal oxide conductive layers are pattern-etched in use. The improvement thereof is thus also needed.

3) Because of the thinness of ITO films, scratches due to abrasion are generated during transportation, processing, and use of the films, causing the occurrence of defects such as deterioration in conductivity, disconnection, and deterioration in appearance.
4) Since water wettability on ITO films is poor, improvement of printing and coating onto ITO films, as well as of adhesion properties of adhesives or the like, has been an issue to be addressed; and there is a need for improvement in water wettability (decrease in contact angle of water) on the film surface.

To improve these drawbacks, films in which a transparent layer (e.g., $SiO_2$, $Al_2O_3$, transparent resins) whose refractive index of light is smaller than that of ITO is formed on the surface of an ITO film have been proposed (for example, Patent Literature 1 and 2).

Patent Literature 1 discloses a method for producing a transparent conductive film, in which after a high-frequency sputter etching treatment is applied to the surface of a polyethylene terephthalate film, a transparent conductive thin film is formed thereon, and a transparent dielectric thin film having a film thickness of 100 Å or more is formed on the transparent conductive thin film. By forming the dielectric thin film, enhancement of scratch resistance and improvement in transparency are attempted.

Patent Literature 2 discloses a transparent conductive laminated body in which a transparent conductive thin film is formed on one surface of a transparent film substrate having a thickness of 2 to 120 μm, a transparent dielectric thin film is formed on the conductive thin film, and a transparent substrate is adhered to the other surface of the film substrate via a transparent adhesive layer. By forming the dielectric thin film, transparency and scratch resistance are enhanced, and improvement in operability as a characteristic of touch panels is also attempted.

By such layer formation, the above-mentioned drawbacks can be improved. However, because such a transparent dielectric thin film is an electrical insulation layer, conductivity between a metal oxide conductive layer and an electrode (such as a conductive paste layer and a metal layer) disposed on the dielectric thin film layer is very poor and unstable. In addition, because of the presence of the electrical insulation layer, it is difficult to pattern-etch the metal oxide conductive layer (ITO) film when needed.

For these reasons, transparent conductive substrates having a dielectric thin film layer formed on a metal oxide conductive layer, which are unsuitable for applications in which ITO film etching and a lead electrode are required, such as touch panels and solar cells, have limited applications.

Patent Literature 3 discloses an inorganic microporous film having ultrafine pores with an average pore diameter of 0.1 nm to 10 μm that penetrate straight through with substantially the same diameter from the front surface to the rear surface of the film, and that this inorganic microporous film is produced by depositing an inorganic material in an oblique manner. Separate films, polarizing films, catalyst carrying films, colored films, and the like are mentioned as applications of the inorganic microporous film.

CITATION LIST

Patent Literature

PTL 1: Japanese Unexamined Patent Publication No. H2-27617
PTL 2: Japanese Unexamined Patent Publication No. H2-213006
PTL 3: Japanese Unexamined Patent Publication No. H8-27561

SUMMARY OF INVENTION

Technical Problem

An object of the present invention is to provide a transparent conductive substrate that has high conductivity between a transparent conductive thin film layer such as ITO and a metal electrode, excellent transparency, excellent scratch resistance, and excellent water wettability, and that can be etched.

Solution to Problem

The present inventors found that when a transparent metal oxide layer having fine pores penetrating the front surface and rear surface thereof is disposed on a transparent conductive thin film layer, conductivity between the transparent conductive thin film layer and a metal electrode on the transparent metal oxide layer can be significantly increased without impairing transparency.

The present invention has been accomplished based on these findings and further research. The present invention provides the following transparent conductive substrate, method for producing the transparent conductive substrate, and the like.

Item 1. A transparent conductive substrate comprising:
a transparent conductive thin film layer and a transparent metal oxide layer disposed in this order on one or both surfaces of a substrate;
the transparent metal oxide layer having numerous fine pores penetrating from the front surface to the rear surface thereof, and the pore diameters of the pores at the surface of the transparent metal oxide layer that is opposite to the surface of the transparent metal oxide layer that is in contact with the transparent conductive thin film layer being larger than those at the surface of the transparent metal oxide layer that is in contact with the transparent conductive thin film layer.

Item 2. The transparent conductive substrate according to Item 1, wherein the average pore diameter of the pores at the surface of the transparent metal oxide layer that is not in contact with the transparent conductive thin film layer is 100 to 1000 nm.

Item 3. The transparent conductive substrate according to Item 1 or 2, wherein the surface porosity of the surface of the transparent metal oxide layer that is not in contact with the transparent conductive thin film layer is 5 to 90%.

Item 4. The transparent conductive substrate according to any one of Items 1 to 3 further comprising a metal electrode disposed on the transparent conductive thin film layer or transparent conductive thin film layers.

Item 5. A touch panel comprising the transparent conductive substrate according to any one of Items 1 to 4.

Item 6. A electrode for solar cell comprising the transparent conductive substrate according to any one of Items 1 to 4.

Item 7. A heater comprising the transparent conductive substrate according to any one of Items 1 to 4.

Item 8. A substrate for electromagnetic wave/electrostatic shielding comprising the transparent conductive substrate according to any one of Items 1 to 4.

Item 9. A method for producing the transparent conductive substrate according to any one of Items 1 to 4, comprising forming the transparent metal oxide layer on the surface of the transparent conductive thin film layer or transparent conductive thin film layers by oblique deposition.

Advantageous Effects of Invention

The transparent conductive substrate of the present invention has high conductivity between a transparent conductive thin film layer and a metal electrode, excellent transparency, excellent scratch resistance, and excellent water wettability; and can be etched.

DESCRIPTION OF EMBODIMENTS

Hereunder, the transparent conductive substrate of the present invention and the method for producing the transparent conductive substrate are explained in detail.

Transparent Conductive Substrate

The transparent conductive substrate of the present invention comprises a transparent conductive thin film layer and a transparent metal oxide layer disposed in this order on one or both surfaces of a substrate, and the transparent metal oxide layer has numerous fine pores penetrating from the front surface to the rear surface thereof.

Figure 1:
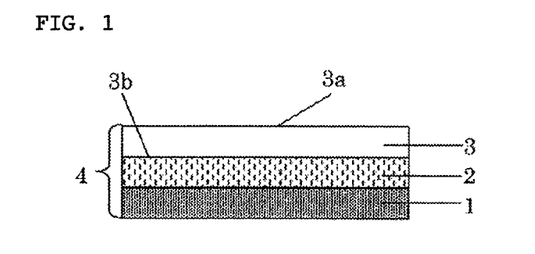
FIG. 1 is a cross-sectional view of one example of the transparent conductive substrate of the present invention.

FIG. 1 shows one example of the transparent conductive substrate of the present invention.

(Substrate)

As the substrate of the present invention, glass, and various plastic films and sheets (plates) having transparency can be used. Examples of the plastic films and sheets include those containing polyester, polycarbonate, polyamide, polyimide, polyolefin, polyvinyl chloride, polyvinylidene chloride, polystyrene, polyvinyl alcohol, polyacrylate, polyarylate, polyphenylene sulfide, or the like as a resin component. Among these, polyester is particularly preferable. Among polyesters, polyethylene terephthalate is particularly preferable.

The thickness of the substrate is not particularly limited, and can be selected depending on the characteristics of the target product. In the case of a film, the thickness is generally about 6 µm to about 400 µm, and preferably about 20 µm to about 200 µm. In the case of a sheet- or plate-like substrate, the thickness is generally about 400 µm to about 5 mm.

In order to increase the adhesion of the transparent conductive thin film layer, a corona treatment, flame treatment, plasma treatment, or like physical treatment may be applied, as a preliminary treatment, to the surface of the substrate prior to the formation of the transparent conductive thin film layer on the substrate. A hard coating layer may be formed on one or both surfaces of the substrate. Prior to the formation of the transparent conductive thin film layer, dust removal or cleaning may be performed, if necessary, by means of solvent cleaning, ultrasonic cleaning, or the like.

(Transparent Conductive Thin Film Layer)

There is no particular limitation on the material for the transparent conductive thin film layer, as long as it has transparency and conductivity. Examples thereof include indium oxide containing tin oxide, tin oxide containing antimony, and zinc oxide.

A known technique, such as vacuum deposition, sputtering, and ion plating, can be used for forming the transparent conductive thin film layer.

The thickness of the transparent conductive thin film layer is not particularly limited, and is generally 5 nm to 2000 nm, and preferably 10 nm to 1000 nm. When the thickness falls within this range, the transparent conductive thin film layer will have satisfactory conductivity and transparency.

In addition, to increase the adhesion of the transparent metal oxide layer, plasma treatment or the like may be applied, as a preliminary treatment, to the surface of the transparent conductive thin film layer prior to the formation of the transparent metal oxide layer on the transparent conductive thin film layer.

(Transparent Metal Oxide Layer)

The transparent metal oxide layer of the present invention has numerous fine pores penetrating from the front surface to the rear surface thereof.

Figure 2:
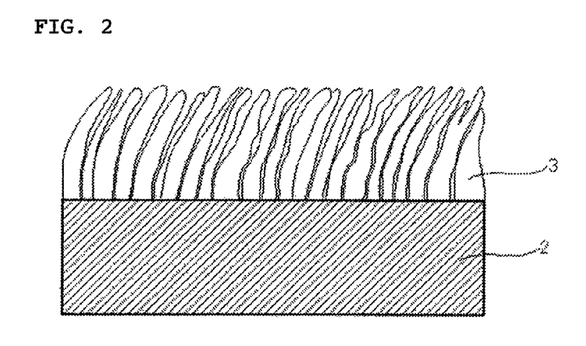
FIG. 2 is an enlarged cross-sectional view of the transparent metal oxide layer of the present invention.

The average pore diameter of the fine pores at the surface (hereinafter also referred to as rear surface; 3b in FIG. 1) that is in contact with the transparent conductive thin film layer is 10 nm to 200 nm, and preferably 50 nm to 100 nm. The average pore diameter of the fine pores at the surface (hereinafter also referred to as front surface; 3a in FIG. 1) that is not in contact with the transparent conductive thin film layer is 100 nm to 1000 nm, and preferably 350 nm to 700 nm. As shown in FIG. 2, it is preferred that the pore diameters of fine pores at the front surface are larger than those at the rear surface. This does not include the case where the diameters of pores at the front surface are substantially the same as those at the rear surface because of the following reasons. To form fine pores penetrating the transparent metal oxide layer with substantially the same pore diameter by oblique deposition, the incidence angle of the deposition must be narrowly limited by providing a slit or the like to decrease a deposition area, resulting in a slow rate of film formation, and poor productivity. Further, in the case of fine pores penetrating the transparent metal oxide layer with substantially the same pore diameter, the contact area between the transparent conductive thin film layer and the transparent metal oxide layer is decreased as the pore diameter increases; therefore, the adhesion between these layers becomes weak. The average pore diameter of the pores at the front surface is generally 3 to 70 times, preferably 7 to 15 times, and more preferably 7 to 10 times larger than that at the rear surface.

Figure 3:
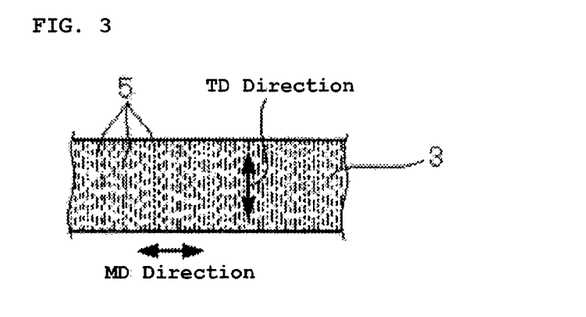
FIG. 3 is a top view of the transparent metal oxide layer of the present invention.
Figure 4:
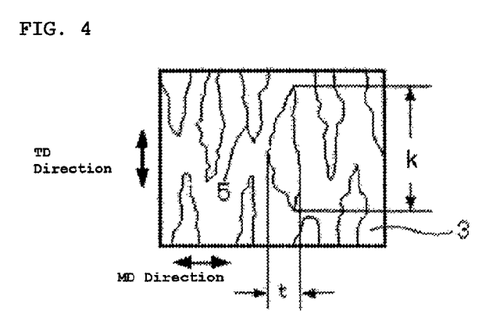
FIG. 4 is an enlarged top view of the transparent metal oxide layer of the present invention.

As shown in FIGS. 3 and 4, the fine pores have an elongated shape, and generally a pore diameter k in the TD direction (width direction) is larger than a pore diameter t in the MD direction (longitudinal direction). In this case, the abovementioned average pore diameter indicates the average value of pore diameters k in the TD direction.

The surface porosity of the front surface of the transparent metal oxide layer of the present invention can be determined as [pore area/front surface area of the transparent metal oxide layer]×100(%). It can be suitably selected in the range of generally 5 to 90%, and preferably 40 to 90%.

The number of fine pores at the front surface of the transparent metal oxide layer is generally 4 to 10 pores/0.5 μm square, and preferably 5 to 7 pores/0.5 μm square, but is not particularly limited to these ranges.

The thickness of the transparent metal oxide layer is generally in the range of 50 nm to 300 nm, and preferably 75 nm to 120 nm.

As the material for the transparent metal oxide layer, any material can be used as long as a transparent metal oxide layer having fine pores can be formed. Examples thereof include $TiO_2$, $Ta_2O_5$, $ZrO_2$, $SiO$, $SiO_2$, $Al_2O_3$, $SnO_2$, $In_2O_3$, $MgO$, and $MoO_3$. Materials such as $MoO_3$, $SiO$, $SiO_2$, and $Al_2O_3$ that can form a transparent metal oxide layer whose refractive index n1 of light is smaller than a refractive index n2 of light of the transparent conductive thin film layer are preferred for the reason that the effect of improving transmittance is attained. These materials may be used singly, or in a combination of two or more. In addition, the transparent metal oxide layer can be formed by, for example, the below-described method.

(Metal Electrode)

The transparent conductive substrate of the present invention may comprise a metal electrode disposed on the transparent metal oxide layer or transparent metal oxide layers.

Examples of the material for the metal electrode include Cu, Ag, Al, Au, Ni, Ni/Cr, Cr, and Ti. These metals may be used singly, or in a combination of two or more in the form of an alloy or a metal paste. However, the material is not particularly limited thereto.

The thickness of the metal electrode is not particularly limited, and is generally 0.01 μm to 50 μm, and preferably 0.02 μm to 25 μm.

In the formation of the metal electrode, a known method can be used, such as plating, vacuum deposition, and sputtering. When a metal paste is used, methods such as printing methods and coating methods can be employed.

If necessary, a layer formed of Ni, Ni/Cr, Cr, Ti, Mo, C, or an oxide thereof may be formed beneath and on the metal electrode to protect the metal electrode.

Further, if necessary, on the surface of the transparent conductive substrate of the present invention that is opposite to the surface on which the transparent conductive thin film layer is formed, a hard coating layer or an antiglare layer may be formed, or a transparent adhesive layer or the like may be formed and stuck to another substrate. In addition, the transparent conductive thin film layer and the transparent metal oxide layer of the present invention may be formed on both surfaces of the substrate of the present invention.

The transparent conductive substrate of the present invention can be used as a transparent electrode for a touch panel, electrode for solar cell, heater, substrate for electromagnetic wave/electrostatic shield, and the like. More specifically, the transparent conductive substrate of the present invention can be used as an upper electrode and/or lower electrode in a resistive or capacitive touch panel; and by disposing this touch panel on the front surface of a liquid crystal display, a display apparatus having a touch panel function can be obtained. Among them, the transparent conductive substrate of the present invention can be suitably used as an electrode for a capacitive touch panel, in particular as an electrode for a projected capacitive touch panel.

Figure 5:
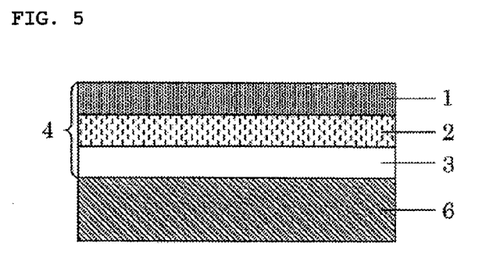
FIG. 5 is a schematic diagram showing the cross section of one example of a capacitive touch panel.

FIG. 5 schematically shows a cross section of a common capacitive touch panel using the transparent conductive substrate of the present invention. In FIGS. 5, 4 indicates a transparent conductive substrate, and 6 indicates glass. During the operation of the touch panel, when a user touches an arbitrary position on the transparent conductive substrate with a finger, the touched position is detected due to the changes in electric charge of the touch panel electrode surface.

Figure 6:
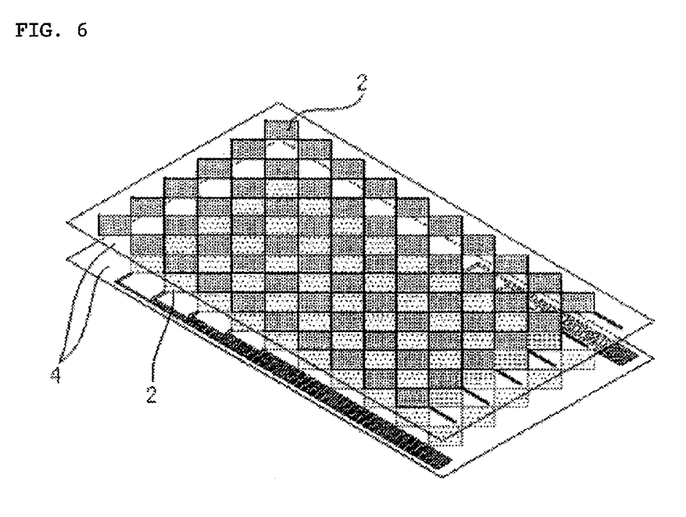
FIG. 6 is a schematic diagram showing one example of a projected capacitive touch panel.

FIG. 6 schematically shows a common projected capacitive touch panel using the transparent conductive substrate of the present invention. In a capacitive touch panel using a matrix-type conductive pattern, as shown in FIG. 6, an upper conductive pattern detects a vertical position because it is connected vertically, whereas a lower conductive pattern detects a horizontal position because it is connected horizontally; and a point at the intersection of these positions can be recognized as a pressed position.

Method for Producing Transparent Conductive Substrate

The method for producing the above-described transparent conductive substrate of the present invention comprises forming the transparent metal oxide layer on the surface of the transparent conductive thin film layer or transparent conductive thin film layers by oblique deposition.

As the oblique deposition, known oblique deposition techniques can be used. Examples thereof include the method disclosed in Japanese Unexamined Patent Publication No. H8-27561. Methods such as using a vacuum evaporator, depositing a vapor deposition material onto a support supplied by a roll, and obliquely depositing a vapor deposition material onto a substrate by disposing a partial shielding plate between an evaporation source and the substrate are preferably employed.

Figure 7:
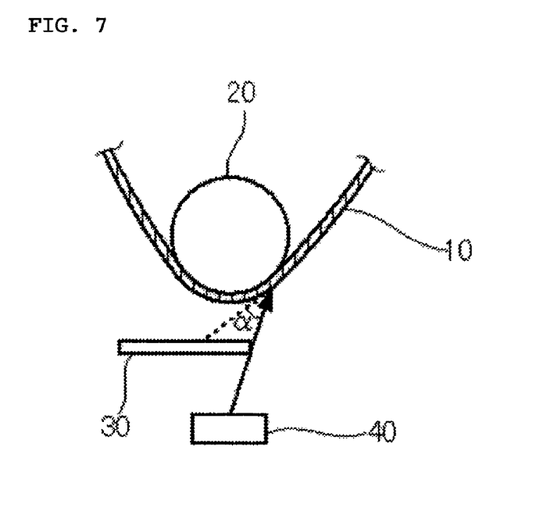
FIG. 7 shows an example of the production method of the transparent conductive substrate of the present invention.

FIG. 7 shows one example of the method for producing the transparent conductive substrate of the present invention. In the method shown in FIG. 7, in a vacuum container (chamber), a vapor deposition material as an evaporation source 40 is heated and vaporized or sublimed, slanted by using an deposition preventing plate 30 with respect to a separately placed substrate 10 having a transparent conductive thin film layer formed thereon (hereinafter, also referred to as substrate 10), and deposited on the substrate 10. By depositing the deposition material in an oblique manner on the substrate 10, a transparent metal oxide layer having numerous fine pores penetrating from the front surface to the rear surface thereof is formed. The substrate 10 is supplied by a rotating roll 20.

Here, the average pore diameter of the fine pores, the surface porosity, and the number of the fine pores can be suitably adjusted in the above-described range by appropriately setting an incidence angle α, or the like, during vapor deposition according to the size of asperities, shape, and directionality of the surface of substrate 10. In addition, the thickness of the transparent metal oxide layer can be suitably adjusted by setting a predetermined vapor deposition rate and vapor deposition time according to a metal oxide to be deposited. When an incidence angle of vapor deposition is continuously decreased (brought as close to 0° as possible) as the film thickness increases during the formation of the transparent metal oxide layer by vapor deposition, the diameters of pores at the front surface of the transparent metal oxide layer can be larger than those at the rear surface of the transparent metal oxide layer.

The degree of vacuum during oblique deposition is $10^{-3}$ Torr or less, preferably $10^{-4}$ Torr or less, and more preferably $10^{-7}$ to $2 \times 10^{-4}$ Torr. For deposition of a deposition material, a known method in which the deposition material can be heated and vaporized can be used. Examples thereof include resistance heating, electron beam, high-frequency induction, and laser; and heating and vaporization by electron beam is preferable.

EXAMPLES

The present invention is described in detail below with reference to Examples. The present invention is, however, not limited to these Examples, etc.

Example 1

Using an ITO target containing 5 wt % of $SnO_2$, an ITO film (about 60 nm thick) with a surface resistance R of 100 (Ω/□) was formed on the PET side surface of a PET film with a hard coating on one surface by sputter deposition in an Ar gas atmosphere containing about 2% $O_2$ gas at a degree of vacuum of $3 \times 10^{-3}$ Torr. Subsequently, a $SiO_2$ film having a thickness of about 100 nm was formed on the ITO film by a device as shown in FIG. 7 at a degree of vacuum of $<2 \times 10^{-4}$ Torr and at an incidence angle θ of ≤90° (θ=90° to 0°) by electron beam deposition to obtain the desired transparent conductive film.

The total light transmittance of the PET film substrate having a hard coating on one surface was about 91%.

Example 2

The desired transparent conductive film was formed in the same manner as in Example 1, except that the incidence angle of electron beam deposition was set to θ<60° (θ=60° to 0°).

Example 3

The desired conductive film was formed in the same manner as in Example 1, except that the incidence angle of electron beam deposition was set to θ<45° (θ=45° to 0°).

Comparative Example 1

In the same manner as in Example 1, except that an $SiO_2$ film was not formed on an ITO film, an ITO film with a surface resistance R of 100 (Ω/□) was formed using an ITO target containing 5 wt % of $SnO_2$ on the PET side surface of a PET film with a hard coating on one surface by sputter deposition in an Ar gas atmosphere containing about 2% $O_2$ gas at a degree of vacuum of $3 \times 10^{-3}$ Torr to obtain a transparent conductive film.

Comparative Example 2

A transparent conductive film was formed in the same manner as in Example 1, except that the incidence angle of electron beam deposition was set to θ=90°±10° (normal incidence).

Comparative Example 3

A transparent conductive film was formed in the same manner as in Example 1, except that a $SiO_2$ layer was formed on an ITO film by sputter deposition, instead of by electron beam deposition, using a Si target in an Ar gas atmosphere containing $O_2$ gas at a degree of vacuum of $3 \times 10^{-3}$ Torr. The incidence angle θ of $SiO_2$ deposition in this process was about 90°.

Comparative Example 4

A transparent conductive film was formed in the same manner as in Example 1, except that a slit was provided in the deposition preventing plate (incidence angle adjusting plate), and deposition was performed so that the incidence angle of the deposition was adjusted in a range of 40° to 50° via the slit. The deposition rate of the $SiO_2$ film was about half that of Example 3. The deposition method corresponds to that disclosed in Patent Literature 3 (Japanese Unexamined Patent Publication No. H8-27561).

The obtained transparent conductive films were evaluated for the following items, and the results are shown in Table 1.

Evaluation Method

1) Observation of Pore Size of $SiO_2$ Film

Each $SiO_2$ deposited film was observed from the upper surface of the ITO film to the upper surface of the $SiO_2$ film in an arbitrary thickness direction by TEM (Electron Scanning Microscope), and (a) average pore diameter: (average value of pore diameters A in the TD direction) and (b) surface porosity: (pore diameter A in the TD direction×pore diameter B in the MD direction×the number of pores/upper surface area of treated film)×100(%) were determined.

The TEM observation in an arbitrary thickness direction was carried out by etching the $SiO_2$ film from its upper surface by Ar ion sputtering, removing the $SiO_2$ film to an arbitrary thickness, and observing the surface of the remaining $SiO_2$ film by TEM. At the time of the surface observation, the cross section of the $SiO_2$ film was also observed. Note that the analysis value in the portion of the $SiO_2$ film having a thickness of about 5 nm was defined as the analysis value in the ITO upper surface portion.

2) Surface Resistance R0 (Ω/□)

The surface resistance on the ITO film or the $SiO_2$ film was measured using the four-terminal measurement method, and each of the measurement values was defined as a film surface resistance R0.

3) Contact Electrical Resistance Rs (Ω) between Electrodes and ITO

The transparent conductive films were cut to a 5 cm width, and two Ag paste electrodes (each about 10 μm thick; Dotite FA401CA, manufactured by Fujikurakasei Co., Ltd. was used; the cure temperature after printing was about 150° C.×30 minutes) each having a width of 10 mm were formed in the width direction so that the distance between the electrodes became 5 cm, or two Cu electrodes (each 10 mm wide and about 180 nm thick) were formed in the width direction by general sputter deposition so that the distance between the electrodes became 5 cm. Resistance Ra between both of the electrodes was measured by the two-terminal method, and the contact electrical resistance was determined using the formula Rs=Ra−R0.

4) Total Light Transmittance

The total light transmittance of the transparent conductive films was measured using HGM-2DP, manufactured by Suga Test Instruments Co., Ltd.

5) Etching Test of ITO Film

ITO-07N (oxalic acid-based etching solution for ITO) manufactured by Kanto Kagaku was used. The time necessary for the ITO film to be etched (the time necessary for the etching to be confirmed by visual observation, and for the electrical resistance of the film surface to become $>1 \times 10^6 \Omega$) at a solution temperature of 20° C. and 50° C. was measured.

6) Scratch Resistance

A Heidon surface property measuring device manufactured by Shinto Scientific Co., Ltd. was used. After the thin film surface was rubbed under the conditions of (a) abrasion material: gauze (Japanese Pharmacopoeia, type 1), (b) load: 100 g/cm$^2$, (c) abrasion rate: 30 am/min., and (d) number of times of abrasion: 100 times/(50 round trips), the film surface resistance Rb was measured. The rate of change (Rb/R0) to the initial film surface resistance R0 was determined, and scratch resistance was evaluated. Note that the surface resistance measurement was conducted by cutting the transparent conductive films to a 1 cm width, forming two Cu electrodes (each 10 mm wide and about 180 nm thick) by general sputter deposition so that the distance between the electrodes became 1 cm, and measuring resistance Ra between both of the electrodes by the two-terminal method.

7) Water Wettability (Contact Angle of Water) of Film Surface

Using a contact angle meter manufactured by Kyowa Interface Science Co., Ltd., a contact angle θ of water of the film surface was measured.

TABLE 1

| | SiO$_2$ Film Cross-Section State | | | | | Surface Resistance R0 (Ω/□) | | Contact Resistance | Contact Resistance |
|---|---|---|---|---|---|---|---|---|---|
| | ITO upper surface | About 25 nm from ITO upper surface | About 50 nm from ITO upper surface | About 75 nm from ITO upper surface | SiO$_2$ film upper surface (about 100 nm from ITO upper surface) | ITO upper surface | SiO$_2$ film upper surface | Between Ag Paste Electrodes and ITO | Between Cu Deposited Electrodes and ITO |
| Ex. 1 | 10 | 50 | 100 | 500 | 700 | 100 | $>1 \times 10^6$ | 200 | 0 |
| | <1 | 2 | 5 | 60 | 90 | | | | |
| Ex. 2 | 50 | 100 | 350 | 650 | 700 | 100 | $>1 \times 10^3$ | 100 | 0 |
| | 2 | 5 | 40 | 85 | 90 | | | | |
| Ex. 3 | 100 | 350 | 550 | 700 | 700 | 100 | 100 | 50 | 0 |
| | 5 | 40 | 70 | 90 | 90 | | | | |
| Compar. Ex. 1 | — | — | — | — | — | 100 | — | 15 | 0 |
| | — | — | — | — | — | | | | |
| Compar. Ex. 2 | 0 | 0 | 0 | 0 | 0 | 100 | $>1 \times 10^6$ | $>1 \times 10^6$ | $>1 \times 10^6$ |
| | 0 | 0 | 0 | 0 | 0 | | | | |
| Compar. Ex. 3 | 0 | 0 | 0 | 0 | 0 | 100 | $>1 \times 10^6$ | $>1 \times 10^6$ | $>1 \times 10^6$ |
| | 0 | 0 | 0 | 0 | 0 | | | | |
| Compar. Ex. 4 | 90 | 90 | 90 | 100 | 100 | 100 | $>1 \times 10^6$ | $>1 \times 10^6$ | >100 |
| | 3 | 3 | 3 | 4 | 4 | | | | |

| | Total Light Transmittance T (%) | Etching Property of ITO Film | | Scratch Resistance (Rb/R0) | Contact Angle (°) of Water of Film Surface |
|---|---|---|---|---|---|
| | | Solution Temp.: 20° C. | Solution Temp.: 50° C. | | |
| Ex. 1 | 92 | 25 min. | 1 min. | 1.0 | 5 |
| Ex. 2 | 91 | 20 min. | 0.7 min. | 1.0 | 2 |
| Ex. 3 | 91 | 20 min. | 0.6 min. | 1.0 | 1 |
| Compar. Ex. 1 | 78 | 3 min. | 0.5 min. | 2.5 | 70 |
| Compar. Ex. 2 | 91 | >50 min. | >50 min. | 1.0 | 14 |
| Compar. Ex. 3 | 91 | >50 min. | >50 min. | 1.0 | 14 |
| Compar. Ex. 4 | 91 | >50 min. | 50 min. | 1.0 | 3 |

1) In the "SiO$_2$ Film Cross-Section State," the upper cell indicates "average pore diameter (nm)," and the lower cell indicates "surface porosity (%)."
2) Etching Property of ITO film: Etching time >50 min. indicates that the ITO film cannot be etched within 50 minutes.
3) In all of the fine pores of each SiO$_2$ layer, the pore diameter T in the TD (width) direction was about 10 times longer than the pore diameter M in the MD direction; the fine pores were elongated in the planar direction (T = 10 × M).

(Discussion)

Example 1

It was found that in the case of an incidence angle of θ<90°, although the surface resistance value measured by the four-terminal measurement method was high, electrical connection was made by Ag paste or Cu electrode method. This is attributable to numerous fine pores that become larger from the lower surface toward the upper surface of the SiO$_2$ film; the average pore diameter and the surface porosity measured by the observation of cross-section state of the SiO$_2$ film were respectively 10 nm and <1% in the ITO upper surface, 100 nm and 5% in the portion having a film thickness of 50 nm, and 700 nm and 90% in the SiO$_2$ film upper surface.

Due to this metal oxide layer, etching treatment for the ITO film has become possible for the first time. In addition, scratch resistance of the ITO film due to the SiO$_2$ film was high.

However, contact resistance with the Ag paste electrodes was high, i.e., 200Ω, resulting in limited applications in the case where Ag paste electrodes are used (the average Ag particle size of the Ag paste used this time was a common size, about 2 μm to about 5 μm; therefore, the contact resistance is considered to be decreased if an Ag paste product composed of smaller Ag particles is used).

On the other hand, contact resistance between the Cu sputter-deposited electrodes and the ITO was 0Ω. This contact resistance value of 0Ω is attributable to the fact that, in a film formed by depositing Cu in the form of an atom, the diameters of Cu deposition particles are sufficiently smaller than the pore diameters of the metal oxide layer in the Examples.

Example 2

It was found that in the case of an incidence angle of $\theta<60°$, the average pore diameter and surface porosity of the $SiO_2$ layer were both larger than those of Example 1, and contact resistance with Ag paste electrodes was reduced to about 100Ω, a preferred range. It was also found that it was possible to shorten the etching time for the ITO film.

Example 3

It was found that in the case of an incidence angle of $\theta<45°$, the average pore diameter and surface porosity of the $SiO_2$ layer were both larger than those of Example 1 and those of Example 2. This further reduced contact resistance between the Ag paste electrodes and the ITO film. It was found that the etching property of the ITO film was good, and that the water contact angle of the surface was significantly improved.

Comparative Example 1

With respect to the transparent conductive film of Comparative Example 1 having no $SiO_2$ layer on the ITO layer, there are no problems regarding contact resistance with the Ag paste electrodes and the Cu deposited electrodes, and the etching property of the ITO film. However, transparency was as low as 78%, and scratch resistance of the ITO film was poor. It was also found that water wettability was as high as 70°; therefore, printing properties were poor.

Additionally, after ITO film etching, ITO film portions (total light transmittance of 78%) and portions having no ITO film (total light transmittance of 91%) were visually observed clearly. This indicates that the improvement thereof is needed.

Comparative Examples 2 and 3

The transparent conductive films of Comparative Examples 2 and 3, in which a $SiO_2$ (non-porous) film was formed on an ITO film by a general method, had high contact resistance with the Ag paste electrodes and the Cu-deposited electrodes; therefore, electrode conduction was not possible. In addition, it was not possible to perform ITO film etching treatment. For these reasons, these transparent conduct films cannot be applied to the field of electronic circuits, such as touch panels and transparent heaters. Additionally, the contact angle of water was unsatisfactory, i.e., 14°.

Comparative Example 4

The transparent conductive film of Comparative Example 4 is a film formed so that the diameters of fine pores of a $SiO_2$ layer are almost the same on the side in contact with the ITO film and on the upper surface of the $SiO_2$ layer, and the fine pores penetrate straight through with substantially the same pore diameter from the front surface to the rear surface of the $SiO_2$ layer (the incidence angle $\theta$ is similar to that of Example 3, but is limited to $\theta=40°$ to $50°$). Transparency, scratch resistance, and contact angle of water were improved, whereas contact resistance between the electrodes and the ITO film was extremely high because the pore diameters and porosity were small. Additionally, the etching property of the ITO film was significantly poor. These facts indicate that this transparent conductive film cannot be used in the above-mentioned electronic circuit field.

If the incidence angle $\theta$ is set to about 3°, it is expected that the pore diameters and porosity will become large and that the contact resistance with the electrodes and the etching property will be improved; however, the contact area between the ITO film and the $SiO_2$ layer will be significantly decreased (because the diameters of the pores of the $SiO_2$ film are almost the same on the front surface side and on the rear surface side), resulting in reduced adhesion between the ITO film and $SiO_2$ film. This causes peeling of the $SiO_2$ film to occur; therefore, this transparent conductive film cannot be employed in the intended use of the present invention. In addition, because the deposition incidence angle (deposition area) is limited to a narrower range compared to that of the method of the present invention, the rate of $SiO_2$ film treatment will be significantly decreased. This is also not preferable in terms of productivity in the intended use of the present invention.

(Touch Panel)

Using the transparent conductive substrates of Examples 1 to 3, a touch panel having a structure as shown in FIG. 5 can be obtained.

| Explanation of reference numerals | |
|---|---|
| 1 | substrate |
| 2 | transparent conductive thin film layer |
| 3 | transparent metal oxide layer |
| 3a | front surface of the transparent metal oxide layer |
| 3b | rear surface of the transparent metal oxide layer |
| 4 | transparent conductive substrate |
| 5 | fine pores |
| 6 | glass |
| 10 | substrate having a transparent conductive thin film layer formed thereon |
| 20 | rotating roll |
| 30 | deposition preventing plate |
| 40 | evaporation source |

The invention claimed is:

1. A transparent conductive substrate comprising:
a transparent conductive thin film layer and a transparent metal oxide layer disposed in this order on one or both surfaces of a substrate;
the transparent metal oxide layer having numerous fine pores penetrating from the front surface to the rear surface thereof, and the pore diameters of the pores at the surface of the transparent metal oxide layer that is opposite to the surface of the transparent metal oxide layer that is in contact with the transparent conductive thin film layer being larger than those at the surface of the transparent metal oxide layer that is in contact with the transparent conductive thin film layer.

2. The transparent conductive substrate according to claim 1, wherein the average pore diameter of the pores at the surface of the transparent metal oxide layer that is not in contact with the transparent conductive thin film layer is 100 to 1000 nm.

3. The transparent conductive substrate according to claim 1, wherein the surface porosity of the surface of the transparent metal oxide layer that is not in contact with the transparent conductive thin film layer is 5 to 90%.

4. The transparent conductive substrate according to claim 1 further comprising a metal electrode disposed on the transparent conductive thin film layer or transparent conductive thin film layers.

5. A touch panel comprising the transparent conductive substrate according to claim 1.

6. A solar cell comprising the transparent conductive substrate according to claim 1.

7. A heater comprising the transparent conductive substrate according to claim 1.

8. A substrate for electromagnetic wave/electrostatic shielding comprising the transparent conductive substrate according to claim 1.

9. A method for producing the transparent conductive substrate according to claim 1, comprising forming the transparent metal oxide layer on the surface of the transparent conductive thin film layer or transparent conductive thin film layers by oblique deposition.

* * * * *